United States Patent
Huang et al.

(10) Patent No.: US 9,812,434 B2
(45) Date of Patent: Nov. 7, 2017

(54) HOLLOW METAL PILLAR PACKAGING SCHEME

(71) Applicant: Taiwan Semiconductor Manufacturing Company, Ltd., Hsinchu (TW)

(72) Inventors: Chang-Pin Huang, Yangmei Township (TW); Hsien-Ming Tu, Zhubei (TW); Hsien-Wei Chen, Hsinchu (TW); Tung-Liang Shao, Hsinchu (TW); Ching-Jung Yang, Pingzhen (TW); Yu-Chia Lai, Zhunan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/614,096

(22) Filed: Jun. 5, 2017

(65) Prior Publication Data

US 2017/0271316 A1    Sep. 21, 2017

Related U.S. Application Data

(60) Continuation of application No. 15/095,765, filed on Apr. 11, 2016, now Pat. No. 9,679,883, which is a
(Continued)

(51) Int. Cl.
*H01L 23/28* (2006.01)
*H01L 25/00* (2006.01)
(Continued)

(52) U.S. Cl.
CPC ............. *H01L 25/50* (2013.01); *H01L 21/56* (2013.01); *H01L 21/566* (2013.01); *H01L 23/3192* (2013.01); *H01L 23/562* (2013.01); *H01L 24/11* (2013.01); *H01L 24/13* (2013.01); *H01L 24/81* (2013.01); *H01L 25/0657* (2013.01); *H01L 23/293* (2013.01); *H01L 2224/03914* (2013.01); *H01L 2224/0401* (2013.01); *H01L 2224/05008* (2013.01); *H01L 2224/05548* (2013.01); *H01L 2224/05567* (2013.01); *H01L 2224/05647* (2013.01); *H01L 2224/1134* (2013.01); *H01L 2224/1147* (2013.01); *H01L 2224/1181* (2013.01); *H01L 2224/1182* (2013.01); *H01L 2224/1191* (2013.01); *H01L 2224/11462* (2013.01); *H01L 2224/13005* (2013.01); *H01L 2224/13011* (2013.01); *H01L 2224/13012* (2013.01); *H01L 2224/13016* (2013.01); *H01L 2224/13022* (2013.01); *H01L 2224/13024* (2013.01); *H01L 2224/13111* (2013.01); *H01L 2224/13124* (2013.01);
(Continued)

(58) Field of Classification Search
CPC ........... H01L 23/49811; H01L 23/3128; H01L 2924/181; H01L 21/56; H01L 23/28
USPC ................ 438/125, 126, 127, 622, 629, 637
See application file for complete search history.

(56) References Cited

U.S. PATENT DOCUMENTS

6,239,016 B1    5/2001    Ishikawa
7,700,986 B2    4/2010    Huang et al.
(Continued)

*Primary Examiner* — S. V. Clark
(74) *Attorney, Agent, or Firm* — Slater Matsil, LLP (57) ABSTRACT

An integrated circuit includes a bottom substrate, a metal layer disposed over the bottom substrate and a hollow metal pillar disposed on the metal layer. The metal layer and the hollow metal pillar are electrically connected.

20 Claims, 5 Drawing Sheets

Related U.S. Application Data division of application No. 14/030,157, filed on Sep. 18, 2013, now Pat. No. 9,343,417.

(51) Int. Cl.
  *H01L 21/56* (2006.01)
  *H01L 23/31* (2006.01)
  *H01L 23/00* (2006.01)
  *H01L 25/065* (2006.01)
  *H01L 23/29* (2006.01)

(52) U.S. Cl.
  CPC ............ *H01L 2224/13139* (2013.01); *H01L 2224/13147* (2013.01); *H01L 2224/14131* (2013.01); *H01L 2224/16145* (2013.01); *H01L 2224/16148* (2013.01); *H01L 2224/16225* (2013.01); *H01L 2224/16227* (2013.01); *H01L 2224/81193* (2013.01); *H01L 2224/81411* (2013.01); *H01L 2224/81815* (2013.01); *H01L 2225/06513* (2013.01); *H01L 2924/014* (2013.01); *H01L 2924/01008* (2013.01); *H01L 2924/01018* (2013.01); *H01L 2924/181* (2013.01); *H01L 2924/351* (2013.01)

(56) References Cited

U.S. PATENT DOCUMENTS

| | | | |
|---|---|---|---|
| 8,519,472 B2 | 8/2013 | Jeong et al. | |
| 8,847,372 B1* | 9/2014 | Darveaux | H01L 21/56 |
| | | | 257/678 |
| 8,901,726 B2* | 12/2014 | Lin | H01L 25/074 |
| | | | 257/686 |
| 2009/0072398 A1 | 3/2009 | Irsigler et al. | |
| 2010/0013068 A1 | 1/2010 | Huang et al. | |
| 2013/0119549 A1* | 5/2013 | Cheng | B29C 39/10 |
| | | | 257/772 |
| 2013/0161787 A1 | 6/2013 | Kim et al. | |
| 2013/0241071 A1 | 9/2013 | Hsieh | |
| 2015/0200166 A1* | 7/2015 | Kono | H01L 24/03 |
| | | | 257/529 |
| 2015/0228556 A1* | 8/2015 | Lee | H01L 23/481 |
| | | | 257/774 |
| 2015/0348991 A1 | 12/2015 | Simsek-Ege et al. | |
| 2016/0005707 A1* | 1/2016 | Kwon | H01L 24/17 |
| | | | 257/737 |

* cited by examiner

HOLLOW METAL PILLAR PACKAGING SCHEME

PRIORITY CLAIM AND CROSS-REFERENCE

This application claims the benefit to and is a continuation of U.S. patent application Ser. No. 15/095,765, filed on Apr. 11, 2016, entitled "Hollow Metal Pillar Packaging Scheme," which is a divisional of U.S. patent application Ser. No. 14/030,157, filed on Sep. 18, 2013, entitled "Hollow Metal Pillar Packaging Scheme," which applications are incorporated herein by reference.

TECHNICAL FIELD

The present disclosure relates generally to an integrated circuit and more particularly a hollow metal pillar packaging scheme.

BACKGROUND

For integrated circuit packaging, board level thermal cycling tests are used to test the wafer level package. One failure mechanism is solder ball cracks from thermal stress which may cause electrical connection failure. Such cracks result from the mismatch of coefficient of thermal expansion (CTE). A packaging scheme more resistant to thermal stress is desirable.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1A:
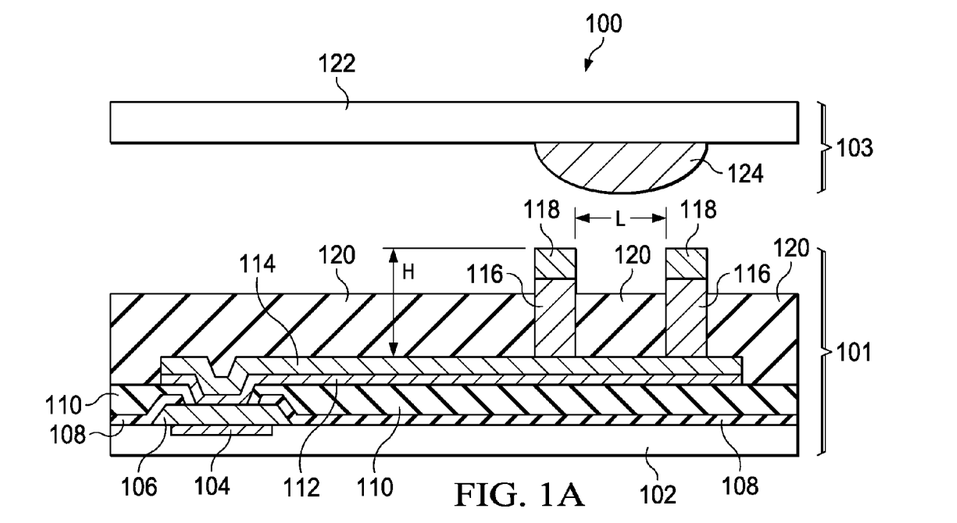
FIG. 1A is a cross section view of an exemplary hollow metal pillar package according to some embodiments.

FIG. 1A is a cross section view of an exemplary hollow metal pillar package 100 according to some embodiments. The hollow metal pillar package 100 includes a bottom package 101 and a top package 103. The bottom package 101 includes a bottom substrate 102, a metal layer 104, a contact pad 106, passivation layers 108 and 110, a seed layer 112 and a metal layer 114 (e.g., a redistribution layer), a hollow metal pillar 116, solder layer 118, and a stress buffer layer 120. The top package 103 includes a top substrate 122 and a solder pad 124.

The bottom substrate 102 and the top substrate 122 comprise silicon, silicon dioxide, aluminum oxide, sapphire, germanium, gallium arsenide (GaAs), an alloy of silicon and germanium, indium phosphide (InP), silicon on insulator (SOI), or any other suitable material. The metal layer 104 is patterned for electrical wiring and comprises copper, aluminum, or any other suitable material. The contact pad 106 provides electrical connections and comprises copper, aluminum, or any other suitable material.

The passivation layers 108 and 110 provide insulation and protection for the surface below. In some embodiments, the passivation layer 108 comprises SiN/SiO and the passivation layer 110 comprises polymer material such as polybenzoxazole (PBO). The seed layer 112 facilitates the formation of the metal layer 114 (i.e., redistribution layer) above, and comprises copper with the metal layer 114 comprising copper in some embodiments.

The hollow metal pillar 116 provides electrical connection between the top package 103 and the bottom package 101. The hollow metal pillar 116 has a better thermal and electrical conductivity and reduced electromigration compared to a conventional solder ball.

The hollow metal pillar 116 comprises copper, aluminum, or any other suitable material. In some embodiments, the hollow metal pillar 116 has a height H of 80 μm-90 μm, an inner diameter L of 140 μm-160 μm, and a thickness T of about 40 μm-50 μm. In other embodiments, the size and dimension can be varied depending on applications.

The hollow metal pillar 116 provides proper standoff distance (height) between bottom substrate 102 and the top substrate 122, which also helps to have better temperature control. In one example, the hollow metal pillar 116 has a height of 90 μm due to a process specification. For example, some fabrication process using liquid molding compound (LMC) as the stress buffer layer 120 has a minimum thickness of 80 μm for the stress buffer layer 120, and the hollow metal pillar 116 should be higher than the stress buffer layer 120 for proper electrical connection.

The stress buffer layer 120 provides structural protection from stress and comprises liquid molding compound (LMC) in some embodiments. The stress buffer layer 120 increases the life time of the structure in the thermal cycle test by reducing the impact of coefficient of thermal expansion (CTE) mismatch of materials around the hollow metal pillar 116.

The hollow metal pillar 116 is higher than the stress buffer layer 120 by about 10 μm to ensure proper electrical contact with the solder pad 124 when the top package 103 is mounted on the bottom package 101 in some embodiments. The solder layer 118 and the solder pad 124 comprise SnAg or any other suitable material. The solder layer 118 has a height of about 10 μm-20 μm in some embodiments.

The hollow metal pillar package 100 saves cost and also provides better temperature cycle test results in life time cycle compared to other packaging schemes. The hollow metal pillar 116 has a better thermal and electrical conductivity and reduced electromigration compared to a conventional solder ball.

A person skilled in the art will understood that the top package 103 is simplified in FIG. 1A, and may have additional layers and features similar to the bottom package 101, such as metal layers, passivation layers, etc. Also, both the top package 103 and the bottom package 101 may include any other devices and components such as transistors, resistors, inductors, and capacitors among others.

Figure 1B:
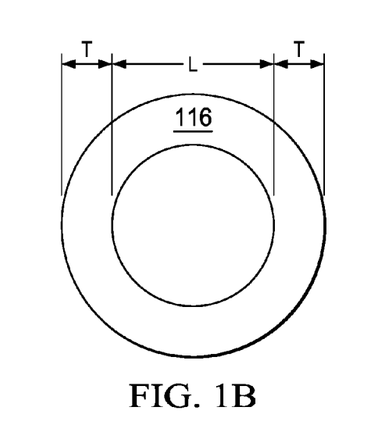
FIGS. 1B-1C are top views of exemplary hollow metal pillars according to some embodiments.
Figure 1C:
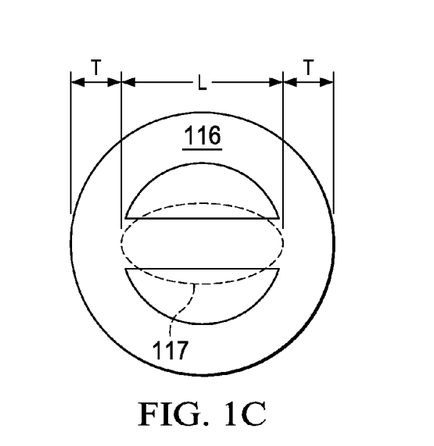

FIGS. 1B-1C are top views of exemplary hollow metal pillars 116 according to some embodiments. In FIG. 1B, the hollow metal pillar 116 has a cylindrical structure with a circular shape top view. In FIG. 1C, the hollow metal pillar 116 has a cylindrical structure with an inside divider 117 added to a circular shape in the top view. The inside divider 117 may increase the life time of the structure in the thermal cycle test for some embodiments.

The inside divider 117 provides better thermal conductivity (i.e., heat transfer) and may be aligned in the direction of coefficient of thermal expansion (CTE) mismatch. In other embodiments, the inside divider 117 may be arranged in a different shape, such as a cross shape with two lines crossing each other (i.e., "+" shape) instead of the one line shape (i.e., "−" shape).

In some embodiments, the hollow metal pillar 116 has a height H of about 80 μm-90 μm, an inner diameter L of 140 μm-160 μm, and a thickness T of about 40 μm-50 μm. In other embodiments, the size and dimension can be varied depending on applications.

Figure 2:
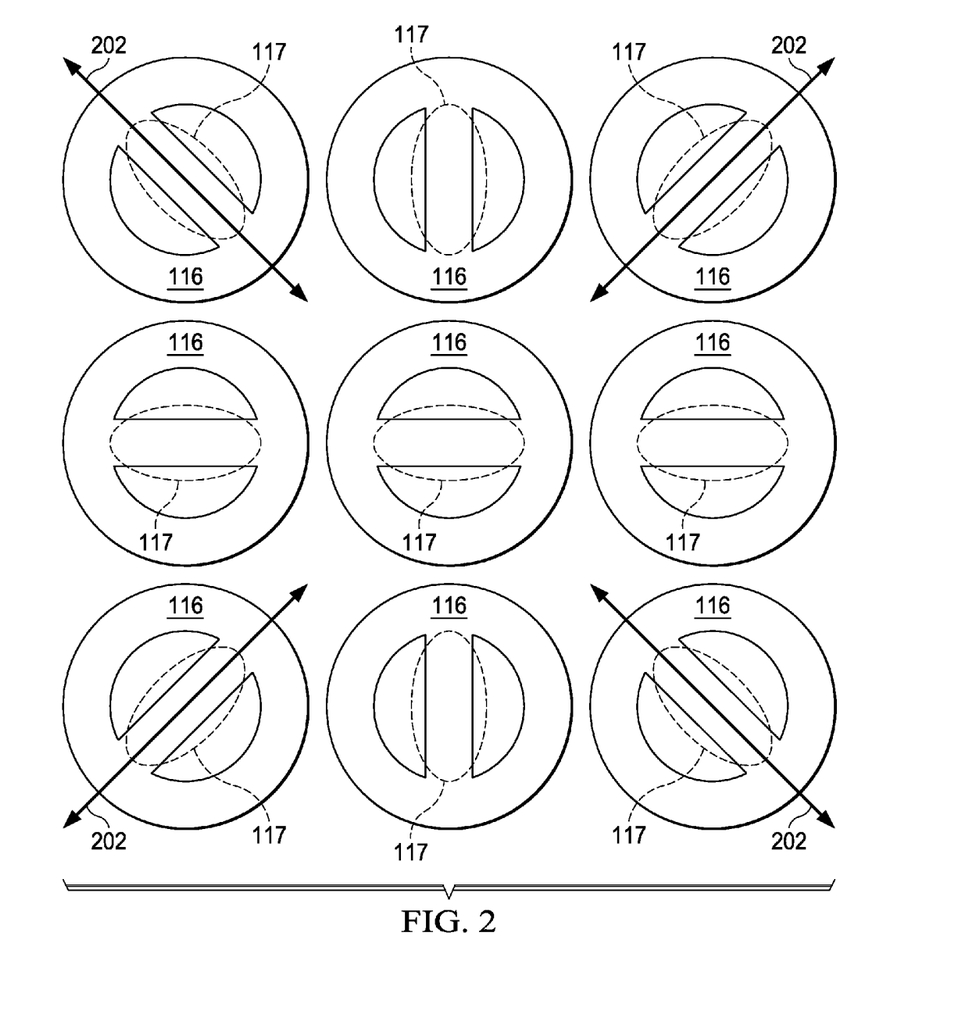
FIG. 2 is a top view of an exemplary arrangement of hollow metal pillars with inside dividers according to some embodiments.

FIG. 2 is a top view of an exemplary arrangement of hollow metal pillars 116 with inside dividers 117 according to some embodiments. The arrows 202 show the direction of CTE mismatch and the inside dividers 117 are aligned in the direction of the CTE mismatch. In other embodiments, the inside dividers 117 can be aligned to other directions depending on applications.

Figure 3A:
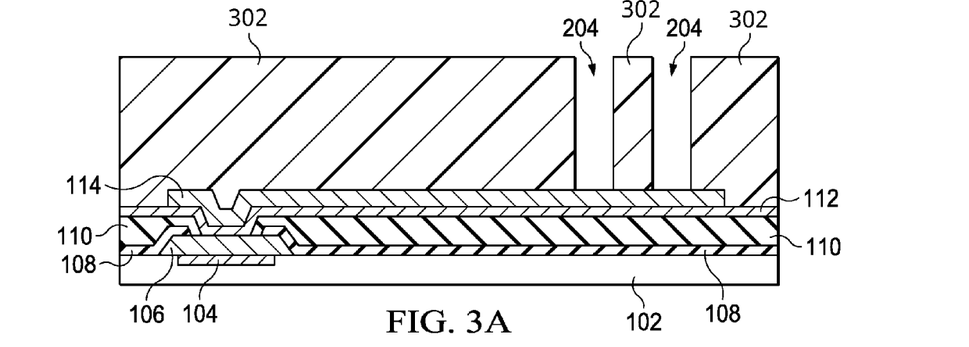
FIGS. 3A-3I are exemplary intermediate fabrication steps of the exemplary hollow metal pillar package in FIG. 1A according to some embodiments.

FIGS. 3A-3I are exemplary intermediate fabrication steps of the exemplary hollow metal pillar package in FIG. 1A according to some embodiments. In FIG. 3A, a photoresist 302 is deposited over the bottom substrate 102 and openings 204 for the hollow metal pillar 116 are formed by a photolithography process. The metal layer 104, the contact pad 106, passivation layers 108 and 110, the seed layer 112 and the metal layer 114 (e.g., a redistribution layer) can be formed by any known method in the art.

Figure 3B:
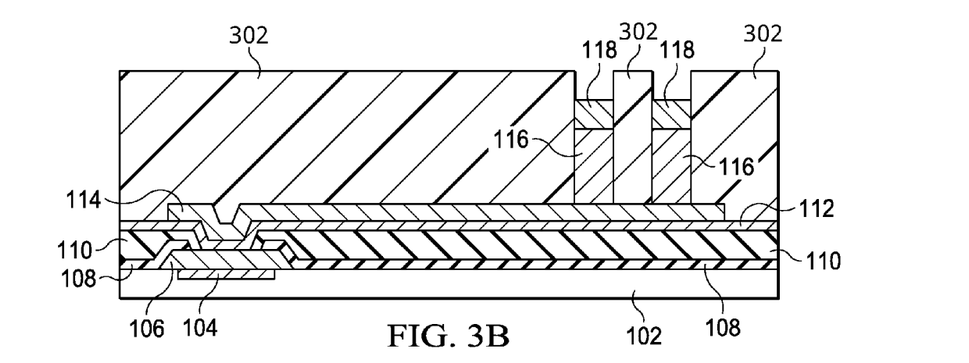

In FIG. 3B, the hollow metal pillar 116 and the solder layer 118 are deposited in the openings 204 by electroplating process, for example. In some embodiments, plasma cleaning such as $O_2$ plasma process can be performed prior to the deposition. The hollow metal pillar 116 comprises copper, aluminum, or any other suitable material. In some embodiments, the hollow metal pillar 116 has a height H of about 80 μm-90 μm, an inner diameter L of 140 μm-160 μm, and a thickness T of about 40 μm-50 μm. In other embodiments, the size and dimension can be varied depending on applications.

The hollow metal pillar 116 provides electrical connection between the top package 103 and the bottom package 101 in FIG. 1A. The hollow metal pillar 116 has a better thermal and electrical conductivity and reduced electromigration compared to a conventional solder ball. The solder layer 118 comprises SnAg or any other suitable material. The solder layer 118 has a height of about 10 μm-20 μm in some embodiments.

Figure 3C:
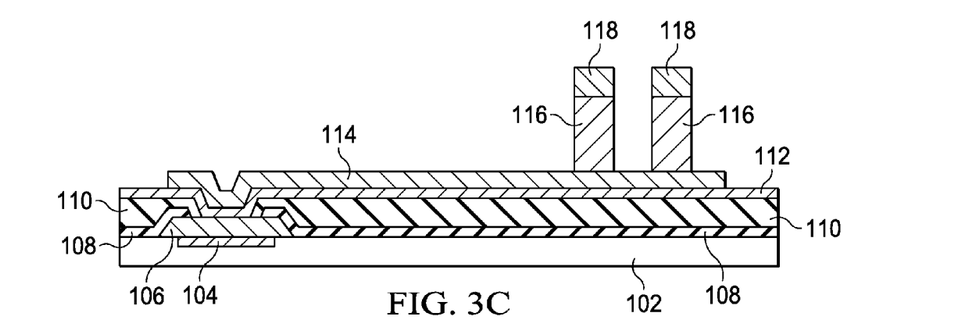

In FIG. 3C, the photoresist 302 is removed by a wet etching process, for example.

Figure 3D:
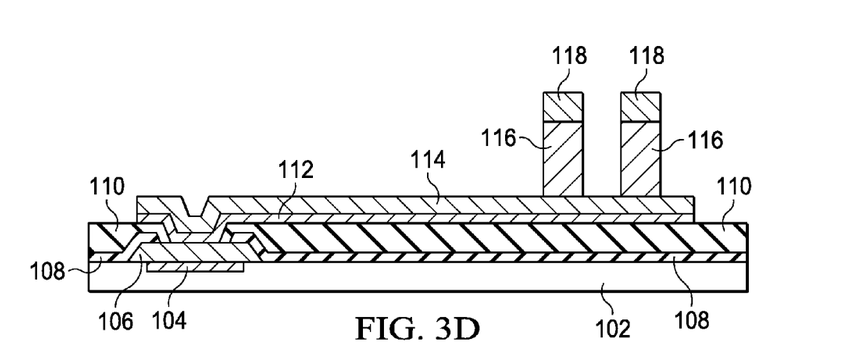

In FIG. 3D, the seed layer 112 outside of the metal layer 114 is removed by an etching process, for example.

Figure 3E:
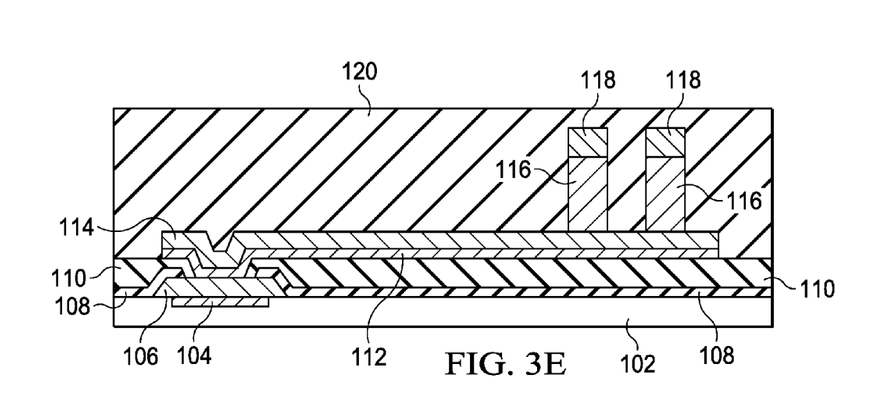

In FIG. 3E, the stress buffer layer 120 (e.g., liquid molding compound) is formed over the metal layer 114, the hollow metal pillar 116 and the solder layer 118 by coating, for example. The stress buffer layer 120 comprises polymer in some embodiments.

Figure 3F:
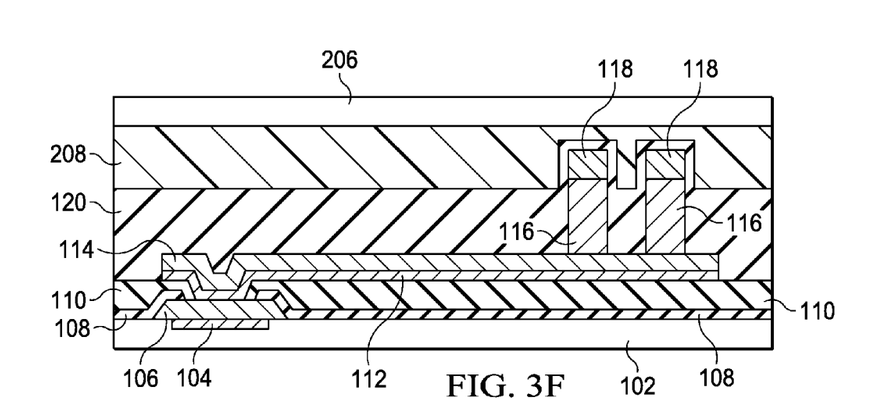

In FIG. 3F, a release film 208 mounted on a carrier 206 is pressed on the stress buffer layer 120. In some embodiments, the release film 208 comprises polymer material and has a thickness of about 100 μm. In some embodiments, the release film 208 is pressured with about 300 kN clamping force and the stress buffer layer 120 is cured with a thermal process for about 7 minutes at about 150° C. temperature.

Figure 3G:
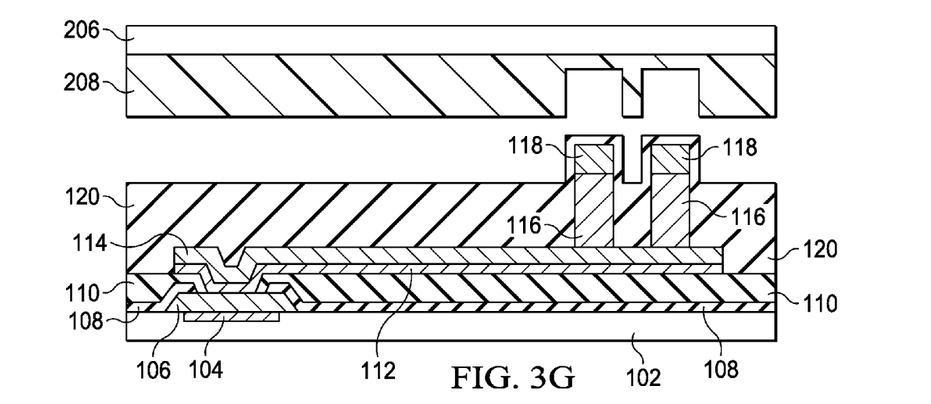

In FIG. 3G, the release film 208 is removed.

Figure 3H:
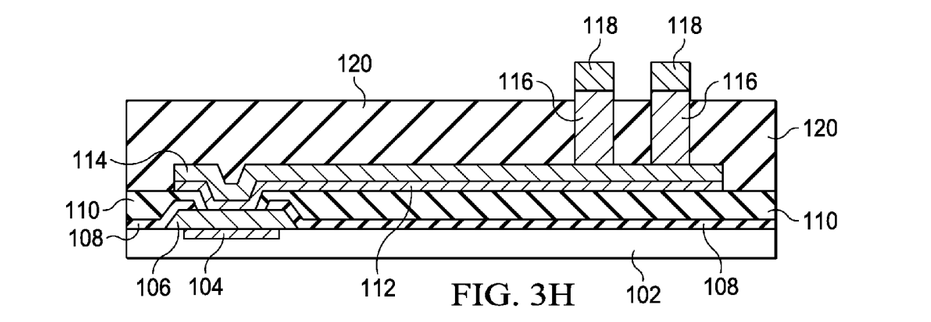

In FIG. 3H, the stress buffer layer 120 is plasma cleaned to expose the solder layer 118 and the top portion of the hollow metal pillar 116. In some embodiments, the plasma cleaning uses $Ar/O_2$ for 60 seconds.

Figure 3I:
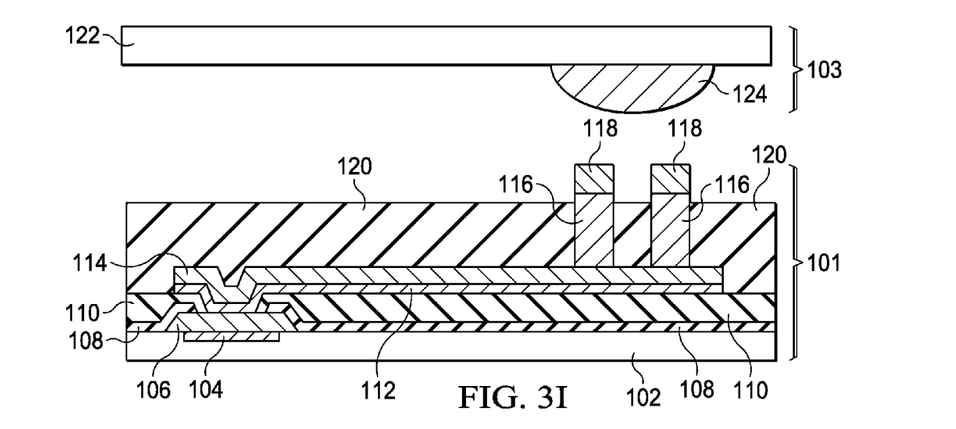

In FIG. 3I, the top package 103 including the top substrate 122 and the solder pad 124 is mounted to the bottom package 101 with the solder layer 118. Then the solder pad 124 and solder layer 118 are reflowed to electrically connect the top package 103 and the hollow metal pillar 116 of the bottom package 101 in some embodiments.

According to some embodiments, an integrated circuit includes a bottom substrate, a metal layer disposed over the bottom substrate and a hollow metal pillar disposed on the metal layer. The metal layer and the hollow metal pillar are electrically connected.

According to some embodiments, a method includes forming a metal layer over a bottom substrate. A hollow metal pillar is formed on the metal layer. The metal layer and the hollow metal pillar are electrically connected.

A skilled person in the art will appreciate that there can be many embodiment variations of this disclosure. Although the embodiments and their features have been described in detail, it should be understood that various changes, substitutions, and alterations can be made herein without departing from the spirit and scope of the embodiments. Moreover, the scope of the present application is not intended to be limited to the particular embodiments of the process, machine, manufacture, and composition of matter, means, methods, and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

In one aspect, embodiments described herein may provide for a method that includes forming a metal layer over a bottom substrate, forming a hollow metal pillar on the metal layer, wherein the metal layer and the hollow metal pillar are electrically connected.

In another aspect, embodiments described herein may provide for a method that includes forming a patterning layer over a package structure having a conductor thereon, the patterning layer having an annular pattern exposing a portion of the conductor, and depositing a first conductive material within the annular pattern. The method further includes depositing a second conductive material within the annular pattern and on the first conductive material, and removing the patterning layer.

In yet other aspects, embodiments described herein may provide for a method that includes forming a hollow metal pillar on a metal layer of a first device, wherein the metal layer and the hollow metal pillar are electrically connected, encapsulating the hollow metal pillar in a stress buffer material, and removing an upper surface of the stress buffer material to expose an upper surface of the hollow metal pillar.

In an embodiment, a method includes: forming a conductive layer over a first substrate; forming a mask layer over the conductive layer; patterning the mask layer to form an opening in the mask layer, the opening exposing a portion of the conductive layer, the opening having an annular shape in a plan view; depositing a first conductive material in the opening; depositing a second conductive material in the opening and over the first conductive material, the second conductive material being different from the first conductive material; removing the mask layer; depositing a molding compound over the first conductive material and the second conductive material; and removing a portion of the molding compound to expose a sidewall of the first conductive material, and a sidewall and a top surface of the second conductive material.

In another embodiment, a method includes: forming a conductive layer over a first substrate; forming a mask layer over the conductive layer; patterning the mask layer to form a first opening in the mask layer, the first opening exposing a first portion of the conductive layer, the first opening having an annular shape in a plan view; depositing a conductive material in the first opening; removing the mask layer to form a second opening in the conductive material, the second opening exposing a second portion of the conductive layer, the second portion of the conductive layer being different from the first portion of the conductive layer; and filling the second opening with a molding compound.

In yet another embodiment, a method includes: forming a metal layer over a first substrate; forming a photoresist layer over the metal layer; patterning the photoresist layer to form a first opening in the photoresist layer, the first opening having an annular shape in a plan view; depositing a metallic material in the first opening, the metallic material being in electrical contact with the metal layer; removing the photoresist layer to form one or more second openings in the metallic material; depositing an insulating material over the metallic material, the insulating material filling the one or more second openings; and removing a portion of the insulating material to expose sidewalls of the one or more second openings.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method comprising:
   forming a conductive layer over a first substrate;
   forming a mask layer over the conductive layer;
   patterning the mask layer to form an opening in the mask layer, the opening exposing a portion of the conductive layer, the opening having an annular shape in a plan view;
   depositing a first conductive material in the opening;
   depositing a second conductive material in the opening and over the first conductive material, the second conductive material being different from the first conductive material;
   removing the mask layer;
   depositing a molding compound over the first conductive material and the second conductive material; and
   removing a portion of the molding compound to expose a sidewall of the first conductive material, and a sidewall and a top surface of the second conductive material.

2. The method of claim 1, further comprising:
   before forming the conductive layer over the first substrate, forming a seed layer over the first substrate; and
   after removing the mask layer, removing portions of the seed layer not covered by the conductive layer.

3. The method of claim 1, wherein the first conductive material comprises a metallic material, and wherein the second conductive material comprises a solder material.

4. The method of claim 1, wherein depositing the molding compound over the first conductive material and the second conductive material comprises depositing a portion of the molding compound within an inner perimeter of the annular shape.

5. The method of claim 1, wherein removing the portion of the molding compound comprises performing a plasma cleaning process on the molding compound.

6. The method of claim 1, further comprising:
   forming a pad over a second substrate;
   mounting the second substrate to the first substrate; and
   reflowing the pad and the second conductive material to electrically connect the second substrate to the first substrate.

7. The method of claim 1, further comprising:
   forming a release film over the molding compound;
   applying a pressure to the molding compound through the release film;
   curing the molding compound; and
   removing the release film.

8. A method comprising:
   forming a conductive layer over a first substrate;
   forming a mask layer over the conductive layer;
   patterning the mask layer to form a first opening in the mask layer, the first opening exposing a first portion of the conductive layer, the first opening having an annular shape in a plan view;
   depositing a conductive material in the first opening;
   removing the mask layer to form a second opening in the conductive material, the second opening exposing a second portion of the conductive layer, the second portion of the conductive layer being different from the first portion of the conductive layer; and
   filling the second opening with a molding compound.

9. The method of claim 8, further comprising performing a plasma cleaning process on the molding compound to exposed a sidewall of the conductive material.

10. The method of claim 8, wherein removing the mask layer further comprises forming a third opening in the conductive material, the third opening being different from the first opening and the second opening.

11. The method of claim 8, further comprising, before depositing the conductive material, performing a plasma cleaning process.

12. The method of claim 8, further comprising:
before forming the conductive layer over the first substrate, depositing a conductive seed layer over the first substrate; and
after removing the mask layer, etching exposed portions of the conductive seed layer.

13. The method of claim 8, further comprising:
forming a release film over the molding compound;
applying a pressure to the molding compound through the release film;
performing a thermal process on the molding compound; and
removing the release film.

14. The method of claim 8, further comprising:
forming a conductive pad over a second substrate; and
electrically connecting the second substrate to the first substrate by reflowing the conductive pad and the conductive material.

15. A method comprising:
forming a metal layer over a first substrate;
forming a photoresist layer over the metal layer;
patterning the photoresist layer to form a first opening in the photoresist layer, the first opening having an annular shape in a plan view;
depositing a metallic material in the first opening, the metallic material being in electrical contact with the metal layer;
removing the photoresist layer to form one or more second openings in the metallic material;
depositing an insulating material over the metallic material, the insulating material filling the one or more second openings; and
removing a portion of the insulating material to expose sidewalls of the one or more second openings.

16. The method of claim 15, further comprising:
before forming the metal layer over the first substrate, forming a passivation layer over the first substrate;
forming a conductive seed layer over the passivation layer; and
after removing the photoresist layer, etching the conductive seed layer to expose a portion of the passivation layer.

17. The method of claim 15, further comprising depositing a solder material over the metallic material in the first opening.

18. The method of claim 17, further comprising:
forming a solder pad over a second substrate; and
electrically connecting the second substrate to the first substrate by reflowing the solder pad and the solder material.

19. The method of claim 15, wherein the annular shape comprises one or more holes.

20. The method of claim 15, wherein the annular shape comprises two holes and a divider separating the two holes.

* * * * *